(12) United States Patent
Jonishi et al.

(10) Patent No.: US 9,293,525 B2
(45) Date of Patent: Mar. 22, 2016

(54) SEMICONDUCTOR DEVICE AND METHOD OF MANUFACTURING SEMICONDUCTOR DEVICE

(71) Applicant: FUJI ELECTRIC CO., LTD., Kawasaki-shi (JP)

(72) Inventors: Akihiro Jonishi, Matsumoto (JP); Masaharu Yamaji, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/456,630

(22) Filed: Aug. 11, 2014

(65) Prior Publication Data

US 2014/0346633 A1 Nov. 27, 2014

Related U.S. Application Data

(63) Continuation of application No. PCT/JP2013/060992, filed on Apr. 11, 2013.

(30) Foreign Application Priority Data

May 28, 2012 (JP) .................................. 2012-121185

(51) Int. Cl.
*H01L 29/06* (2006.01)
*H01L 29/66* (2006.01)
(Continued)

(52) U.S. Cl.
CPC ........ *H01L 29/063* (2013.01); *H01L 21/26513* (2013.01); *H01L 21/74* (2013.01); *H01L 21/761* (2013.01); *H01L 29/0646* (2013.01); *H01L 29/404* (2013.01)

(58) Field of Classification Search
CPC ............ H01L 21/26513; H01L 21/761; H01L 29/063; H01L 29/0646
USPC ........................................ 257/493; 438/420
See application file for complete search history.

(56) References Cited

U.S. PATENT DOCUMENTS 5,428,241 A 6/1995 Terashima
5,633,521 A 5/1997 Koishikawa
(Continued)

FOREIGN PATENT DOCUMENTS

JP 2000-236067 A 8/2000
JP 3356586 B2 12/2002
(Continued)

OTHER PUBLICATIONS

English Translation JP2009164486A.*
(Continued)

*Primary Examiner* — Christine Enad
(74) *Attorney, Agent, or Firm* — Rossi, Kimms & McDowell LLP

(57) ABSTRACT

A semiconductor device includes a high voltage isolation structure having a double RESURF structure. The high voltage isolation structure separates a low potential region from a high potential region. The high voltage isolation structure has an annular strip shape in a plan view and includes a straight portion and a corner portion which is connected to the straight portion. In the high voltage isolation structure, a p-type RESURF region is formed in a surface layer of a front surface of a substrate in an n-type well region along the outer circumference of the n-type well region. In the corner portion, the total amount of impurities per unit area in the RESURF region is less than that in the straight portion.

9 Claims, 17 Drawing Sheets

(51) Int. Cl.
*H01L 21/761* (2006.01)
*H01L 21/265* (2006.01)
*H01L 21/74* (2006.01)
*H01L 29/40* (2006.01)

(56) References Cited

U.S. PATENT DOCUMENTS

| | | | |
|---|---|---|---|
| 7,476,942 B2 * | 1/2009 | Watanabe et al. | 257/370 |
| 2001/0050394 A1 | 12/2001 | Onishi et al. | |
| 2006/0006555 A1 | 1/2006 | Herman | |
| 2010/0096697 A1 * | 4/2010 | Su et al. | 257/343 |
| 2010/0252904 A1 * | 10/2010 | Takahashi et al. | 257/492 |
| 2012/0037988 A1 * | 2/2012 | Hao | 257/343 |
| 2012/0104492 A1 * | 5/2012 | Chu et al. | 257/335 |
| 2013/0140582 A1 * | 6/2013 | Kawakami et al. | 257/76 |
| 2014/0061790 A1 * | 3/2014 | Chu et al. | 257/339 |
| 2014/0070315 A1 * | 3/2014 | Levy et al. | 257/343 |

FOREIGN PATENT DOCUMENTS

| | | |
|---|---|---|
| JP | 3456054 B2 | 10/2003 |
| JP | 3778061 B2 | 5/2006 |
| JP | 3802935 B2 | 8/2006 |
| JP | 2008-506256 A | 2/2008 |
| JP | 2009-164486 A | 7/2009 |
| JP | 4534303 B2 | 9/2010 |

OTHER PUBLICATIONS

Mohamed et al. "Design and Optimization of Double-RESURF High-Voltage Lateral Devices for a Manufacturable Process," IEEE Trans. on Electron Devices, (U.S.), IEEE, Jul. 2003, vol. 50, No. 7, pp. 1697-1701.

International Search Report issued in PCTJP2013/060992, dated Jul. 16, 2013. English translation provided.

* cited by examiner

SEMICONDUCTOR DEVICE AND METHOD OF MANUFACTURING SEMICONDUCTOR DEVICE

CROSS-REFERENCE TO RELATED APPLICATIONS

This application is a continuation of International Application No. PCT/JP2013/060992, filed on Apr. 11, 2013, which is based on and claims priority to Japanese Patent Application No. JP 2012-121185, filed on May 28, 2012. The disclosure of the Japanese priority application and the PCT application in their entirety, including the drawings, claims, and the specification thereof, are incorporated herein by reference.

BACKGROUND

1. Field of the Invention

The invention relates to a semiconductor device having a double RESURF structure and a method for manufacturing a semiconductor device.

2. Related Art

A high voltage isolation structure having a double RESURF structure has been known as a method for achieving a high breakdown voltage in a semiconductor device with a high breakdown voltage. FIG. 13 is a conceptual cross-sectional view illustrating a semiconductor device including the high voltage isolation structure having the double RESURF structure. As shown in FIG. 13, the double RESURF structure means a structure in which an n-type semiconductor layer 102 is interposed between p-type semiconductor layers 101 and 103.

In the semiconductor device having the double RESURF structure, in order to ensure a high breakdown voltage, the total amount of charge $Q_p$ per unit area in the p-type diffusion layer 103 and the total amount of charge $Q_n$ per unit area in the n-type diffusion layer 102 need to be adjusted such that the following Expressions (1) to (3), which are double RESURF conditions, are satisfied, as described in "Design and Optimization of Double-RESURF High-Voltage Lateral Devices for a Manufacturable Process," IEEE Trans. on Electron Devices, (U.S.), IEEE, JULY 2003, VOL. 50, NO. 7, PP. 1697-1701, also referred to herein as "Non-patent Document 1." The following Expression (1) corresponds to Expression (9) in the following Non-patent Document 1. The following Expression (2) corresponds to Expression (10) in the following Non-patent Document 1. The following Expression (3) corresponds to Expressions (11) and (12) in the following Non-patent Document 1.

The total amount of charge per unit area in each diffusion layer is equivalent to the total net amount of impurities per unit area in each diffusion layer. The total net amount of impurities per unit area in the diffusion layer is the difference between the total amount of p-type impurities per unit area in the diffusion layer and the total amount of n-type impurities per unit area in the diffusion layer, which is obtained by integrating the amount of p-type impurities per unit volume and the amount of n-type impurities per unit volume with respect to the depth of the diffusion layer in an impurity profile of the diffusion layer in the depth direction.

[Equation 1]

$$Q_p \leq 1.4 \times 10^{12} [/cm^2] \quad (1)$$

[Equation 2]

$$Q_n \leq 2.8 \times 10^{12} [/cm^2] \quad (2)$$

[Equation 3]

$$Q_n - Q_p \leq 1.4 \times 10^{12} [/cm^2] \quad (3)$$

As can be seen from Expressions (1) to (3), the balance between the total amount of charge $Q_p$ per unit area in the p-type diffusion layer 103 and the total amount of charge $Q_n$ per unit area in the n-type diffusion layer 102 needs be optimally maintained in the ranges represented by Expressions (1) to (3) in order to ensure a high breakdown voltage in the double RESURF structure. Here, in the total amount of charge or the total amount of impurities, the term "total" is used in order to indicate the total amount which is integrated in the depth direction of each layer.

FIGS. 16A-16D are explanatory diagrams illustrating terms. FIG. 16A is a diagram illustrating an ion implantation dose. The ion implantation dose means the amount of impurities before impurity ions which are implanted into the silicon layer enter the silicon layer. Hereinafter, the dose of ions implanted in order to form the diffusion layer is referred to as the dose of the diffusion layer. FIG. 16B is a diagram illustrating the total amount of impurities per unit area in a straight portion 15 of a high voltage isolation structure 14, which will be described below. FIG. 16C is a diagram illustrating the total amount of impurities per unit area in a corner portion 16 of the high voltage isolation structure 14, which will be described below. FIG. 16D is a diagram illustrating the total net amount of impurities per unit area in the high voltage isolation structure 14. The total amount of charge per unit area is the product of the net amount of impurities per unit area and an elementary charge q (=$1.602 \times 10^{-19}$ coulombs). The total amount of impurities is the amount of impurities after the impurity ions which are implanted into the silicon layer enter the silicon layer. Therefore, as shown in FIG. 16B, when the silicon layer is not covered by the mask, the total amount of impurities is equal to the dose (the total amount of impurities=the dose). On the other hand, as shown in FIG. 16C, when the silicon layer is partially covered by the mask, a small amount of impurity ions is implanted into the silicon layer and the total amount of impurities is less than the dose (the total amount of impurities portion<the dose).

FIGS. 14A and 14B are diagrams illustrating the structure of a semiconductor device 500 including a high voltage isolation structure 64 having a double RESURF structure according to the related art. FIG. 14A is a plan view illustrating a main portion of the semiconductor device 500 and FIG. 14B is a cross-sectional view illustrating the main portion taken along the line A-A and the line B-B of FIG. 14A. The cross-sections taken along the line A-A and the line B-B of FIG. 14A are the same. The high voltage isolation structure 64 is a breakdown voltage structure which separates a low potential region 63 and a high potential region 62 in, for example, an integrated circuit.

In FIG. 14A, the high voltage isolation structure 64 is an annular strip with a constant width which has a substantially rectangular shape in a plan view. The high voltage isolation structure 64 surrounds the high potential region 62. The high voltage isolation structure 64 includes a straight portion 65 and a corner portion 66 which is connected to the end of the straight portion 65 and has a curved shape with a constant curvature.

In FIG. 14B, an n-type diffusion layer 52 with a depth of about 10 μm is formed in a surface layer of a front surface of a p-type silicon substrate 51. A p-type diffusion layer 53 with a depth of about 2 μm is formed in a surface layer of the diffusion layer 52 close to the front surface of the substrate front. The diffusion layer 53 and the silicon substrate 51 are connected to each other through a deep p-type diffusion layer 54, which passes through the n-type diffusion layer 52 in the depth direction, in an outer circumferential portion of the substrate. The high potential region 62, which is the n-type diffusion layer 52, is formed inside the n-type diffusion layer 52 surrounded by the high voltage isolation structure 64. The configuration of the high voltage isolation structure 64 in the vertical direction (depth direction) is a three-layer double RESURF structure in which the p-type diffusion layer 53, the n-type diffusion layer 52, and the p-type silicon substrate 51 overlap each other in this order from the front surface of the substrate.

The diffusion layer 52 is electrically connected to an electrode 59 with a high potential through a high-concentration n-type region 56. The diffusion layer 53 is electrically connected to an electrode 60 with a low potential through a high-concentration p-type region 57. The electrode 59 and the electrode 60 extend on an interlayer insulating film 58 and are electrically connected to a field plate 61a and a field plate 61b, respectively. Reference numeral 55 indicates a LOCOS (Local Oxidation of Silicon) film.

Next, the operation of the high voltage isolation structure 64 will be described. When the potential of the electrode 59 increases, with the electrode 60 fixed to a GND potential, the potential of the high potential region 62 increases through the diffusion layer 52. Then, a depletion layer is spread from the pn junction between the diffusion layer 52 and the diffusion layer 53 and the pn junction between the diffusion layer 52 and the silicon substrate 51, and the diffusion layer 52 and the diffusion layer 53 are completely depleted at the potential, hundreds of volts, of the electrode 59. In this way, the concentration of the electric field between the electrode 59 and the electrode 60 is suppressed. Therefore, it is possible to obtain a high breakdown voltage between the electrode 59 and the electrode 60 and to increase the potential of the high potential region 62 to be higher than that of the low potential region 63 on the same substrate.

Japanese Patent Application Publication No. JP 3778061 A (also referred to herein as "Patent Document 1") discloses a technique in which a high potential region and a breakdown voltage structure region of a p offset region which is shallower than the high potential region are formed using the same mask in order to reduce costs and the bottom of the formed breakdown voltage structure region has a waveform shape.

Japanese Patent Application Publication No. JP 3356586 A (also referred to herein as "Patent Document 2") discloses a technique in which the layout of an extended drain is improved to increase the breakdown voltage of a turn-back portion which is formed when a horizontal MOSFET semiconductor device is laid out on a chip, thereby increasing the breakdown voltage of the entire horizontal MOSFET semiconductor device.

Japanese Patent Application Publication No. JP 3456054 A (also referred to herein as "Patent Document 3") discloses an example in which an $n^+$ region that functions as a stopper for a depletion layer is formed in a surface layer of an n drift layer and the bottom of the $n^+$ region only in a corner portion is formed in a waveform shape, thereby improving the breakdown voltage. Japanese Patent Application Publication No. JP 3802935 A (also referred to herein as ("Patent Document 4") discloses a technique in which, in a double RESURF structure in which a depletion layer is spread, the distance between a main electrode and a pn junction, which are arranged in the double RESURF structure, in a corner portion in which the depletion layer is likely to be spread is more than that in a straight portion, thereby improving the breakdown voltage.

Japanese Patent Application Publication No. JP 4534303 A (also referred to herein as "Patent Document 5") discloses a technique in which an n layer on the surface of a breakdown voltage structure portion is formed by a p layer and an n layer to improve the breakdown voltage.

However, in the double RESURF structure shown in FIG. 14, the optimum condition (optimum value) of the total net amount of charge per unit area in each diffusion layer 52 or 53 or obtaining a maximum breakdown voltage (which is equivalent to the total net amount of impurities per unit area) is different in the straight portion (hereinafter, simply referred to as a straight portion) 65 and the corner portion (hereinafter, simply referred to as a corner portion) 66 of the high voltage isolation structure 64. It is presumed that this is because the spreading of the depletion layer is different in the straight portion 65 and the corner portion 66.

FIG. 15 is a characteristic diagram illustrating the simulation result of the relationship between the dose of ions implanted into the p-type diffusion layer 53 and the breakdown voltage in the straight portion 65 and the corner portion 66 of the semiconductor device 500 shown in FIG. 14. The dose on the horizontal axis is the total amount of impurity ions implanted per unit area and is obtained by integrating the amount of impurities per unit volume in the depth direction. In addition, the dose of the n-type diffusion layer 52 is $4.0 \times 10^{12}/cm^2$ and the dose of the p-type diffusion layer 53 is the same in the straight portion 65 and the corner portion 66. That is, the p-type diffusion layers 53 in the straight portion 65 and the corner portion 66 are formed at the same time by ion implantation.

As can be seen from FIG. 15, the peak of a breakdown voltage curve 71 which is calculated by a simulation for the dose in the straight portion 65 deviates from the peak of a breakdown voltage curve 72 which is calculated by a simulation for the dose at the peak of the corner portion 66. Therefore, the optimum value of the dose of the p-type diffusion layer 53 (the dose at which a peak breakdown voltage is obtained in the breakdown voltage curves 71 and 72 for a dose) deviates to a small dose side in the corner portion 66 with respect to the straight portion 65. The peak breakdown voltage in the corner portion 66 is lower than that in the straight portion 65. This is because the electric field intensity of the corner portion 66 is more than the electric field intensity of the straight portion 65.

As described above, the breakdown voltage curves 71 and 72 which are calculated by a simulation for the dose in the straight portion 65 and the corner portion 66 deviate from each other. Therefore, the breakdown voltage of the element is controlled and reduced along the lower one of the two breakdown voltage curves 71 and 72.

In FIG. 15, the peak value of the breakdown voltage of the element is the breakdown voltage of an intersection between the breakdown voltage curves 71 and 72 which are calculated by simulations. When the dose of the diffusion layer 53 moves in a direction in which the dose is less than the dose of the intersection between the breakdown voltage curves 71 and 72, the breakdown voltage of the element is reduced along the breakdown voltage curve 71 of the straight portion 65. On the other hand, when the dose of the diffusion layer 53 moves in a direction in which the dose is more than the dose of the intersection between the breakdown voltage curves 71 and 72, the breakdown voltage of the element is reduced along the breakdown voltage curve 72 of the corner portion 66. That is, when the actual dose of the diffusion layer 53 deviates from the dose (the optimum value of the dose) of the intersection between the breakdown voltage curves 71 and 72 which are calculated by simulations due to a process variation, the breakdown voltage of the element is rapidly reduced. In addition, the peak value of the breakdown voltage of the element is less than the peak values of the breakdown voltage curves 71 and 72. This will be described in detail below.

In FIG. 1, when a variation in the dose of the diffusion layer 53 due to the process variation is, for example, ±10% and the center value ($5.3 \times 10^{12}/cm^2$) of the dose of the diffusion layer 53 is determined such that a reduction in the breakdown voltage of the element is the minimum, the maximum value of the breakdown voltage of the element is controlled by the breakdown voltage of the corner portion 66 and is 1700 V. The minimum value of the breakdown voltage of the element due to the process variation is the same in the straight portion 65 and the corner portion 66 and is 1400 V.

From the above description, in the high voltage isolation structure 64 with the double RESURF structure, measures capable of further increasing the peak value of the breakdown voltage of the element and further suppressing a reduction in the breakdown voltage of the element due to a process variation are needed.

Patent Document 1 to Patent Document 5 do not disclose a semiconductor device in which, in the high voltage isolation structure with the double RESURF structure, a corner portion is partially covered by a mask such that the amount of impurities implanted into silicon in the corner portion is less than the amount of impurities in a straight portion, thereby improving the breakdown voltage of the element.

SUMMARY OF THE INVENTION

In order to solve the above-mentioned problems of the related art, an object of the invention is to provide a semiconductor device and a semiconductor device manufacturing method which can increase the breakdown voltage of an element and can suppress a reduction in the breakdown voltage of the element due to a process variation in a double RESURF structure.

In order to solve the above-mentioned problems and achieve the object of the invention, a semiconductor device according to an aspect of the invention has the following characteristics. A well region of a second conductivity type is selectively formed in a surface layer of a front surface of a semiconductor substrate of a first conductivity type. A first region of the first conductivity type which has an annular shape in a plan view is formed in the well region.

A second region of the second conductivity type which has an annular shape in a plan view is formed inside the first region of the well region. A RESURF region of the first conductivity type is formed between the first region and the second region in the well region. A high voltage isolation structure is formed which has a double RESURF structure in which the well region is interposed between the semiconductor substrate and the RESURF region. The high voltage isolation structure has a planar shape that includes a straight portion and a corner portion which is connected to the straight portion and has a constant curvature. The RESURF region in the corner portion includes a high concentration region and a low concentration region which has a smaller diffusion depth and a lower impurity concentration than the high concentration region. Both a first total net amount of impurities per unit area in the straight portion of the RESURF region and a second total net amount of impurities per unit area in the corner portion of the RESURF region are equal to or less than $1.4 \times 10^{12}[/cm^2]$. A third total net amount of impurities of the well region is equal to or less than $2.8 \times 10^{12}[/cm^2]$. Both a value obtained by subtracting the first total net amount of impurities from the third total net amount of impurities and a value obtained by subtracting the second total net amount of impurities from the third total net amount of impurities are equal to or less than $1.4 \times 10^{12}[/cm^2]$. The first total net amount of impurities is less than the second total net amount of impurities.

The semiconductor device according to the above-mentioned aspect of the invention may further include an isolation region of the first conductivity type that is formed outside the RESURF region at a depth that is equal to or more than the depth of the well region from the front surface of the semiconductor substrate so as to surround the well region.

In the semiconductor device according to the above-mentioned aspect of the invention, the first total net amount of impurities may be less than the second total net amount of impurities and a difference therebetween may be equal to or less than 20%.

In the semiconductor device according to the above-mentioned aspect of the invention, the semiconductor substrate and the RESURF region may be electrically connected to each other.

In the semiconductor device according to the above-mentioned aspect of the invention, the high concentration region and the low concentration region may come into contact with each other and may be alternately arranged.

In order to solve the above-mentioned problems and achieve the object of the invention, a method for manufacturing the semiconductor device according to another aspect of the invention has the following characteristics. A first step of forming the well region on the semiconductor substrate using the implantation of second-conductivity-type impurity ions and a heat treatment is performed. A second step of forming the RESURF region in the straight portion and the corner portion of the high voltage isolation structure using the implantation of first-conductivity-type impurity ions and the heat treatment is performed. In the second step, the corner portion is partially covered by a mask and the amount of first-conductivity-type impurity ions which are implanted into the semiconductor substrate is less than the amount of first-conductivity-type impurity ions which are implanted into the semiconductor substrate in the straight portion.

In the method for manufacturing the semiconductor device according to the above-mentioned aspect of the invention, in the second step, a dose of the first-conductivity-type impurities, which is obtained by subtracting a dose at which a breakdown voltage of the corner portion is the maximum from a dose at which the breakdown voltage of the straight portion is the maximum, may be blocked by the mask to reduce the amount of first-conductivity-type impurity ions implanted into the semiconductor substrate.

In the method for manufacturing the semiconductor device according to the above-mentioned aspect of the invention, in the second step, a blockage ratio of the mask may be adjusted to adjust the total net amount of impurities of the RESURF region such that a maximum breakdown voltage of a breakdown voltage curve of the straight portion, which is calculated in advance, with respect to the dose of the RESURF region is equal to a maximum breakdown voltage of a breakdown voltage curve of the corner portion, which is calculated in advance, with respect to the dose of the RESURF region.

According to the semiconductor device and the semiconductor device manufacturing method of the invention, it is possible to provide a semiconductor device with a high element breakdown voltage. In addition, according to the semiconductor device and the semiconductor device manufacturing method of the invention, ion implantation and a heat treatment are simultaneously performed for the straight portion and the corner portion. Therefore, it is possible to reduce a process variation and to suppress a reduction in the breakdown voltage of an element, as compared to a structure in which ion implantation is separately performed for the straight portion and the corner portion.

DETAILED DESCRIPTION

Figure 1:
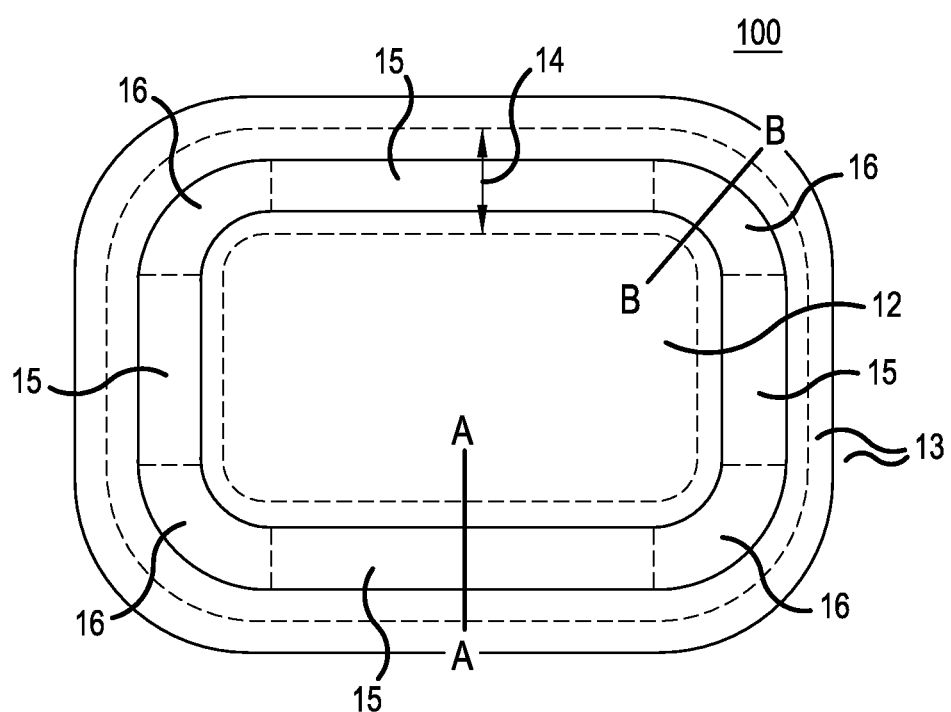
FIG. 1 is a plan view illustrating a main portion of the structure of a semiconductor device 100 according to Embodiment 1 of the invention.

Hereinafter, preferred embodiments of a semiconductor device and a semiconductor device manufacturing method according to the invention will be described in detail with reference to the accompanying drawings. In the description of the following embodiments and the accompanying drawings, the same components are denoted by the same reference numerals and the description thereof will not be repeated.

Figure 2A:
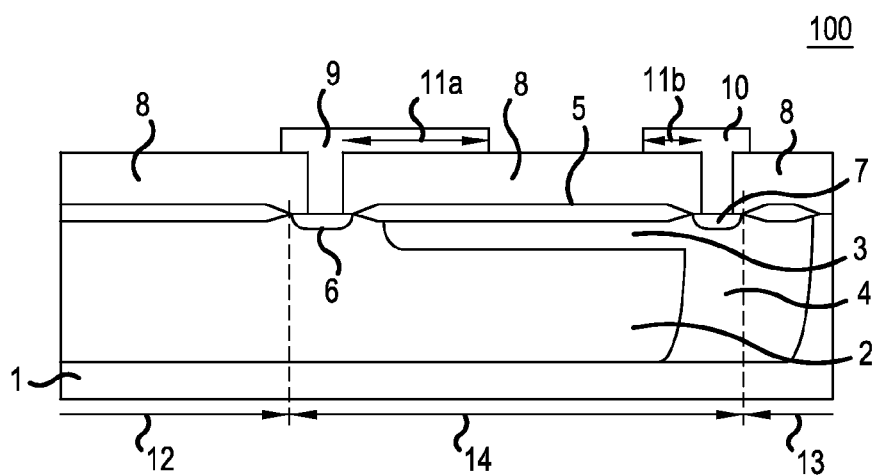
FIGS. 2A-2C are cross-sectional views illustrating the main portion of the structure of the semiconductor device 100 according to Embodiment 1 of the invention.
Figure 2B:
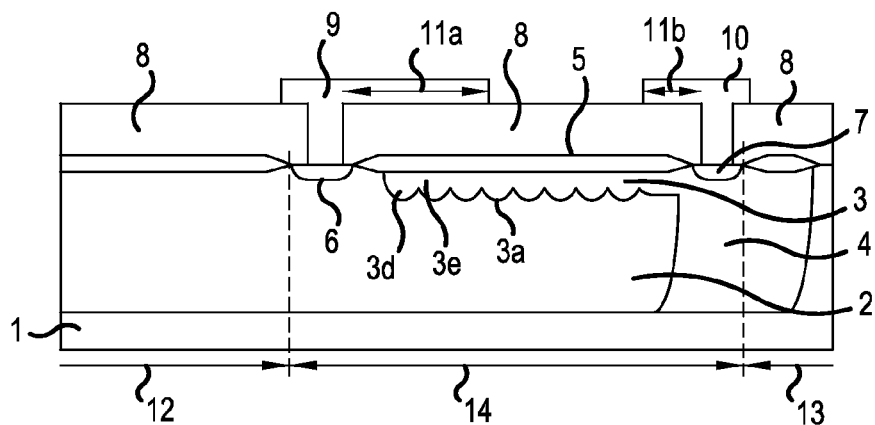
Figure 2C:
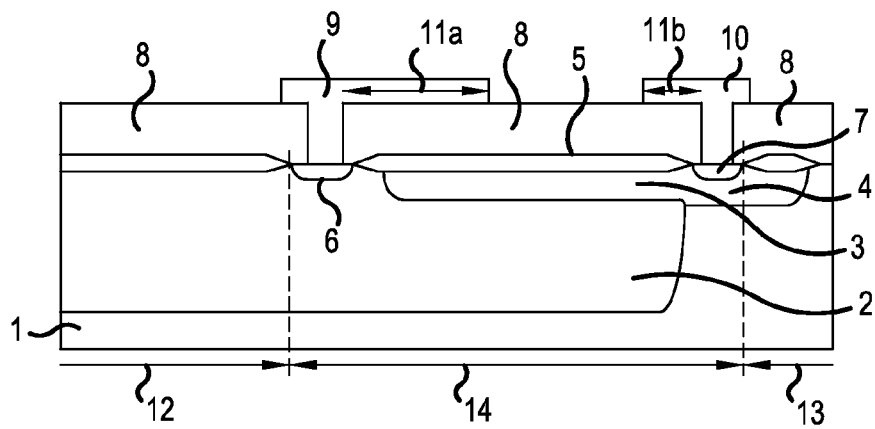

Embodiment 1 FIG. 1 is a plan view illustrating a main portion of the structure of a semiconductor device 100 according to Embodiment 1 of the invention. FIGS. 2A-2C are cross-sectional views illustrating the main portion of the structure of the semiconductor device 100 according to Embodiment 1 of the invention. FIG. 2A is a cross-sectional view illustrating a main part of a straight portion 15 of a high voltage isolation structure 14 taken along the line A-A of FIG. 1 and FIG. 2B is a cross-sectional view illustrating a main part of a corner portion 16 of the high voltage isolation structure 14 taken along the line B-B of FIG. 1. FIG. 2C is a cross-sectional view illustrating a main part of another example of the straight portion 15 of the high voltage isolation structure 14 taken along the line A-A of FIG. 1.

The high voltage isolation structure 14, which will be described below, is a breakdown voltage structure that separates a low potential region 13 and a high potential region 12 in, for example, an integrated circuit. The high potential region 12 is a high-potential-side region to which a voltage is applied from a high voltage supply and the low potential region 13 is a low-potential-side region to which a voltage is applied from a low voltage supply which supplies a lower voltage than the high voltage supply.

Figure 17:
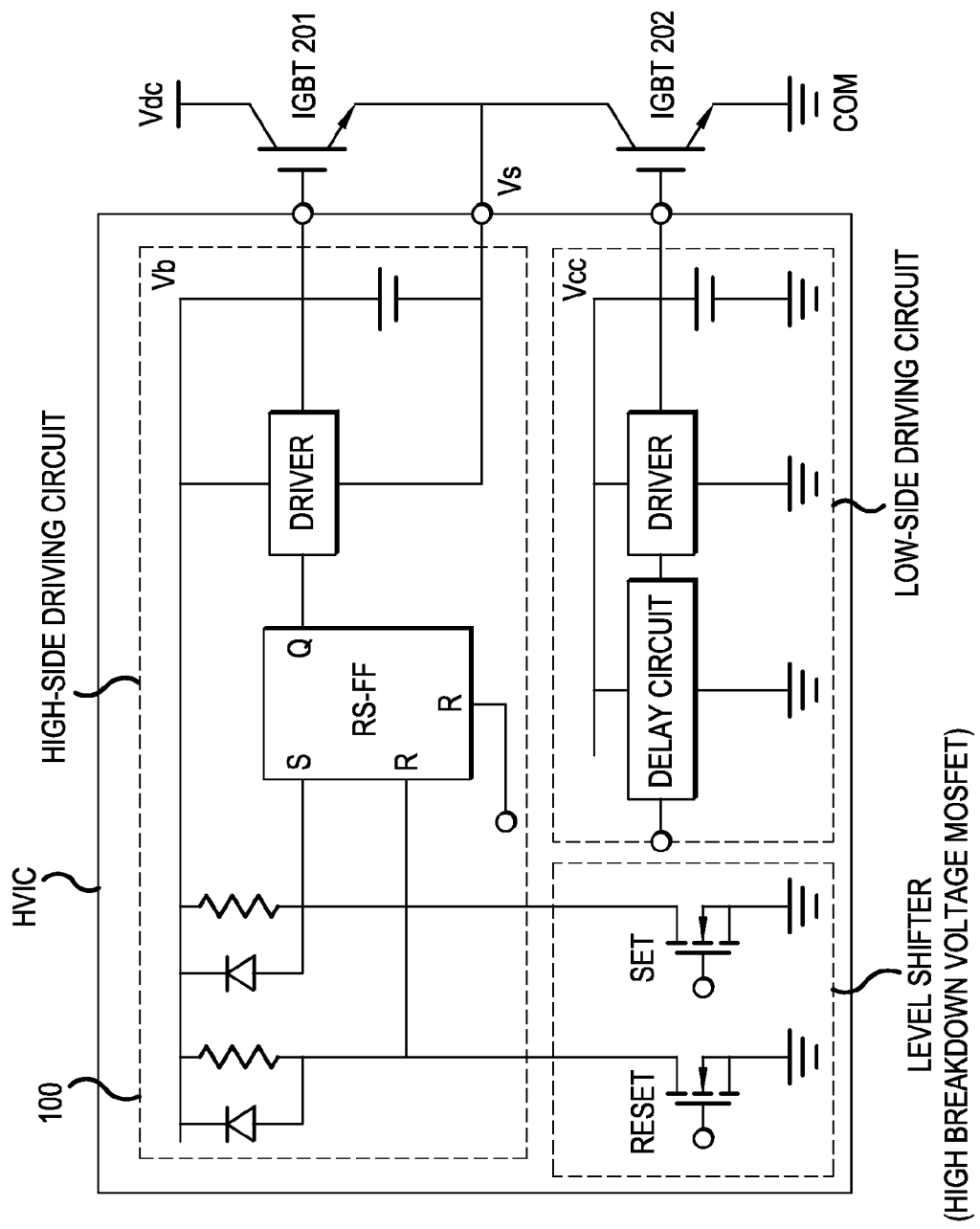
FIG. 17 is a circuit diagram illustrating a gate driving circuit of an IGBT which forms an inverter circuit.

FIG. 17 is a circuit diagram illustrating a gate driving circuit of an IGBT which forms an inverter circuit. FIG. 17 is a circuit diagram illustrating the gate driving circuit of the IGBT forming the inverter circuit which is connected to a COM potential and a high voltage supply Vdc and shows an example in which the semiconductor device 100 shown in FIG. 1 is applied as a portion of a high voltage IC (HVIC). The high voltage IC includes: a high-side driving circuit which is operated by a low voltage supply Vb that has, as a reference potential, the emitter potential (Vs) of a low-potential-side main terminal of an IGBT 201 of an upper arm; a level shifter which transmits a signal from a control circuit (not shown) to the high-side driving circuit; and a low-side driving circuit which receives a signal from the control circuit (not shown), drives an IGBT 202 of a lower arm, and is operated by a low voltage supply Vcc that has, as a reference potential, the emitter potential (COM potential) of a low-potential-side main terminal of the IGBT 202 of the lower arm. A level shift resistor is connected to the level shifter. The high voltage IC controls a current which flows to the level shift resistor using the level shifter and transmits the signal from the control circuit to the high-side driving circuit.

The high-side driving circuit is formed in the high potential region 12 and the low-side driving circuit is formed in the low potential region 13. The high potential region 12 is operated by a power supply which has Vs as a reference potential. When the IGBT 201 is in an on state, the potential of V is equal to that of the high voltage supply Vdc and a high potential is applied to the high potential region 12. The low potential region 13 is arranged on the same silicon substrate 1 as the high potential region 12 so as to surround the high potential region 12 and is electrically separated from the high potential region 12 by the high voltage isolation structure 14.

In FIG. 1, the high voltage isolation structure 14 is an annular strip with a constant width which has a substantially rectangular shape in a plan view. The high voltage isolation structure 14 surrounds the high potential region 12. In a plan view, the high voltage isolation structure 14 includes the straight portions 15 and four corner portions 16 which connect the ends of the straight portions 15 and have a curved shape with constant curvature. The width of the high voltage isolation structure 14 is about 200 μm. The curvature radius of the corner portion 16 of the high voltage isolation structure 14 is about 80 μm.

In FIGS. 2A-2C, an n-type well region 2 with a depth of about 10 μm is formed in a surface layer of a front surface of a p-type silicon substrate 1. The well region 2 has a substantially rectangular shape in a plan view and includes the straight portion and the corner portion which is convex in a diffusion direction. The well region 2 is formed so as to extend from the high potential region 12 to the high voltage isolation structure 14. A p-type RESURF region 3 which has an annular shape in a plan view and has a depth of about 2 μm is formed in the surface layer of the front surface of the substrate at the end of the well region 2 along the outer circumference of the well region 2 in a plan view. The RESURF region 3 and the silicon substrate 1 are connected through a p-type diffusion layer 4 (isolation region) which has the same depth as the well region 2 in an outer circumferential portion of the RESURF region 3. In this way, the silicon substrate 1 and the RESURF region 3 are electrically connected to each other. The RESURF region 3 may not come into contact with the diffusion layer 4, but may be separated from the diffusion layer 4. In this case, the RESURF region 3 becomes a potentially floating region. The diffusion layer 4 may be shallowly formed as shown in FIG. 2C. The high potential region 12, which is the n-type well region 2, is formed inside the n-type well region 2 which is surrounded by the high voltage isolation structure 14. The structure of the high voltage isolation structure 14 in the vertical direction (depth direction) is a three-layer double RESURF structure in which the p-type RESURF region 3, the n-type well region 2, and the p-type silicon substrate 1 sequentially overlap each other from the front surface of the substrate.

The well region 2 is electrically connected to an electrode 9 to which a high potential is applied through a high-concentration n-type region 6 (contact region). The high-concentration n-type region 6 is formed in a portion of the high voltage isolation structure 14 which is close to the high potential region 12. The RESURF region 3 is electrically connected to an electrode 10 to which a low potential is applied through a high-concentration p-type region 7 (contact region). The high-concentration p-type region 7 is formed in a portion of the high voltage isolation structure 14 which is close to the low potential region 13. When the RESURF region 3 is separated from the diffusion layer 4, the high-concentration p-type region 7 is formed in a surface layer of the diffusion layer 4. The electrode 9 is electrically insulated from the electrode 10 by an interlayer insulating film 8. The electrode 9 and the electrode 10 extend on the interlayer insulating film 8 and are electrically connected to a field plate 11a and a field plate 11b in the high voltage isolation structure 14, respectively. A LOCOS (Local Oxidation of Silicon) film 5 is selectively formed between the front surface of the silicon substrate 1 and the interlayer insulating film 8.

Figure 3:
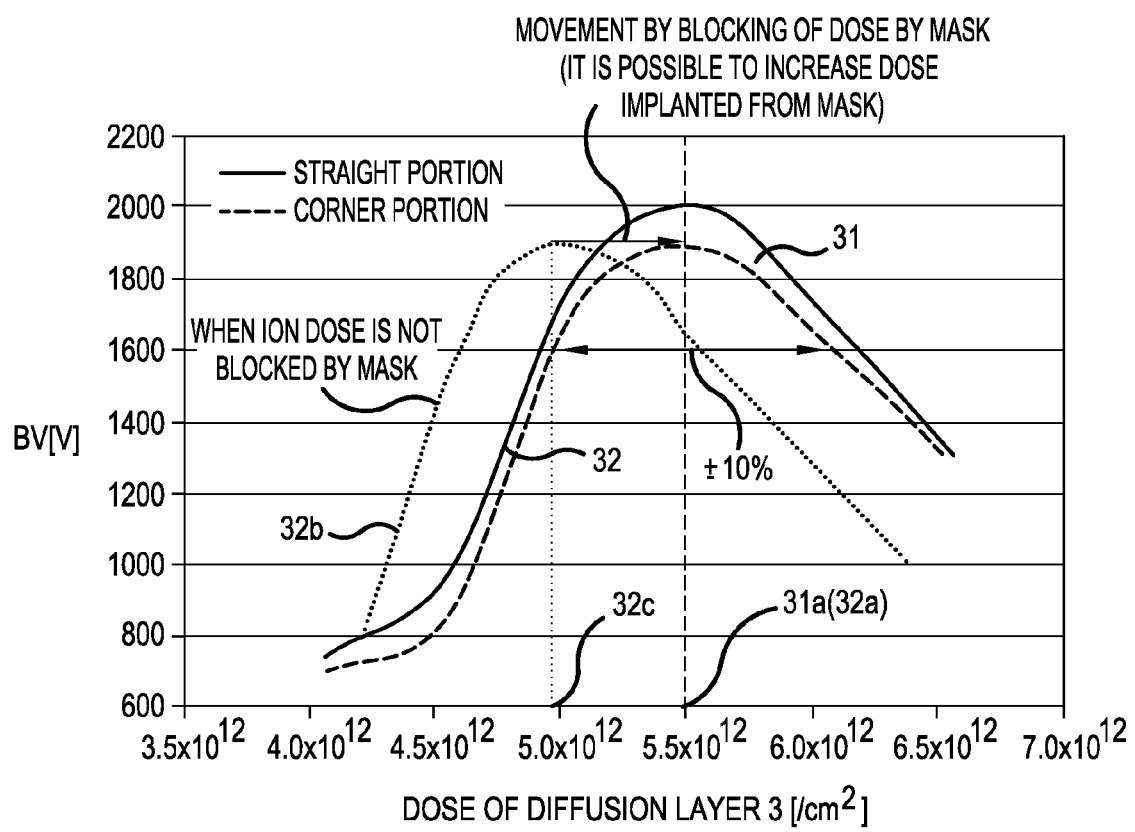
FIG. 3 is a characteristic diagram illustrating a breakdown voltage and the dose of ions implanted into a RESURF region 3 in a high voltage isolation structure 14 of the semiconductor device 100 according to Embodiment 1 of the invention.

In FIG. 2B, in the RESURF region 3 of the corner portion (hereinafter, simply referred to as a corner portion) 16 of the high voltage isolation structure 14, a portion 3d which has high impurity concentration and a large diffusion depth and a portion 3e which has low impurity concentration and a small diffusion depth are alternately arranged. The portions 3d and 3e are connected to each other in FIG. 2B and the bottoms 3a thereof have a waveform shape. The portions 3d and 3e may be separated from each other. In the straight portion 15 of the high voltage isolation structure 14 (hereinafter, simply referred to as a straight portion 15), the total amount of impurities per unit area in the RESURF region 3 and the total net amount of impurities per unit area in the RESURF region 3 are more than those in the corner portion 16. The total amount of impurities per unit area in the RESURF region 3 and the total net amount of impurities per unit area in the RESURF region 3 are calculated from the dose of the RESURF region 3 at which the breakdown voltage of a breakdown voltage curve 32b that is calculated by a simulation for the dose of the RESURF region 3 shown in FIG. 3 is the maximum. However, the total amount of impurities per unit area in the RESURF region 3 and the total net amount of impurities per unit area in the RESURF region 3 are as described above.

The total net amount of impurities per unit area in the well region 2 is $1.0 \times 10^{12}/cm^2$ in both the straight portion 15 and the corner portion 16. The total net amount of impurities per unit area in the RESURF region 3 is $1.0 \times 10^{12}/cm^2$ in the straight portion 15 and is $0.9 \times 10^{12}/cm^2$ in the corner portion 16. The total net amount of impurities per unit area in each diffusion layer corresponds to the total amount of charge per unit area in the diffusion layer. The total net amount of impurities per unit area in the diffusion layer which is calculated from a diffusion profile is less than the dose of the diffusion layer. This is because the diffused p-type impurities and the diffused n-type impurities are compensated by a heat treatment after ion implantation and the amount of impurities is reduced.

Both the total net amount of impurities per unit area in the RESURF region 3 (the total amount of charge $Q_p$ per unit area) and the total net amount of impurities per unit area in the well region 2 (the total amount of charge $Q_n$ per unit area) satisfy $Q_p \leq 1.4 \times 10^{12}[/cm^2]$, $Q_n \leq 2.8 \times 10^{12}[/cm^2]$, and $Q_n - Q_p \leq 1.4 \times 10^{12}[/cm^2]$ which are the double RESURF conditions represented by the above-mentioned Expressions (1) to (3).

FIG. 3 is a characteristic diagram illustrating the relationship between the breakdown voltage and the dose of ions implanted into the RESURF region 3 in the high voltage isolation structure 14 of the semiconductor device 100 according to Embodiment 1 of the invention. The dose of ions implanted into the well region 2 is $4.0 \times 10^{12}/cm^2$. A breakdown voltage curve 31 is calculated by a simulation for the dose of the RESURF region 3 in the straight portion 15. A breakdown voltage curve 32b is calculated by a simulation for the dose of the RESURF region 3 in the corner portion 16 when the dose of the RESURF region 3 is not blocked by a mask. A breakdown voltage curve 32 is for the dose of the RESURF region 3 in the corner portion 16 when 10% of the dose of the RESURF region 3 is blocked by a mask and is calculated from the breakdown voltage curve 32b. The breakdown voltage curves 31 and 32b shown in FIG. 3 are characteristic diagrams which are calculated by simulations in advance. The breakdown voltage curves 31 and 32b may be calculated by experiments.

In the straight portion 15, p-type impurities for forming the RESURF region 3 are implanted into the entire silicon substrate 1. Therefore, the dose of the RESURF region 3 in the straight portion 15 is equal to the total amount of impurities per unit area in the RESURF region 3. In the corner portion 16, since 10% of the p-type impurities for forming the RESURF region 3 are blocked by the mask, the total amount of p-type impurities per unit area implanted into the silicon substrate 1 is reduced by 10%. Therefore, the total amount of impurities per unit area in the RESURF region 3 is 10% less than the dose of the RESURF region 3 in the corner portion 16. As such, a 10% reduction in the total amount of impurities per unit area in the RESURF region 3 means a 10% reduction in the total net amount of impurities (see FIG. 16) in the RESURF region 3.

When the dose of the RESURF region 3 is $5.5 \times 10^{12}$/cm$^2$ in both the straight portion 15 and the corner portion 16, the highest breakdown voltage of the straight portion 15 is 2000 V and the highest breakdown voltage of the corner portion 16 is 1900 V. Since the breakdown voltage of the element is controlled by the highest breakdown voltage of the corner portion 16, it is 1900 V which is higher than the highest breakdown voltage of 1700 V in the structure according to the related art. However, the actual dose of the corner portion 16 is reduced by 10% of $5.5 \times 10^{12}$/cm$^2$ since it is blocked by the mask.

When a process variation is ±10%, the lowest breakdown voltage of the straight portion 15 is 1700 V and the lowest breakdown voltage of the corner portion 16 is 1600 V. Therefore, since the breakdown voltage of the element is controlled by the lowest breakdown voltage of the corner portion 16, it is 1600 V. The voltage of 1600 V is higher than the lowest voltage of 1400 V in the structure according to the related art. This means that a reduction in the breakdown voltage of the element can be suppressed to be less than that in the structure according to the related art.

When the dose of the RESURF region 3 is $5.5 \times 10^{12}$/cm$^2$, the total amount of p-type impurities per unit area in the silicon substrate 1 in the straight portion 15 is $5.5 \times 10^{12}$/cm$^2$ which is equal to the dose of the RESURF region 3. However, 10% of the amount of p-type impurities implanted into the silicon substrate 1 in the corner portion 16 is blocked by the mask. Therefore, in the corner portion 16, the total amount of impurities per unit area in the RESURF region 3 is $4.95 \times 10^{12}$/cm$^2$ which is 10% less than the dose of the RESURF region 3. Therefore, in the corner portion 16, the total net amount of impurities per unit area in the RESURF region 3 is reduced by 10%, as described above.

As described above, 10% of the corner portion 16 is covered by the mask and the amount of ions implanted into the silicon substrate 1 (the total amount of impurities per unit area) in the corner portion 16 is reduced by 10%. Therefore, when a dose of $5.5 \times 10^{12}$/cm$^2$ is implanted, the breakdown voltage has a peak value in the breakdown voltage curve 31 of the straight portion 15 and has a peak value in the breakdown voltage curve 32 of the corner portion 16. That is, when the dose of the RESURF region 3, at which the breakdown voltage has the peak value in the breakdown voltage curve 32b of the corner portion 16 when the corner portion 16 is not covered by the mask, is blocked by the mask, the peak value in the breakdown voltage curve 32 of the corner portion 16 can be moved a distance corresponding to 10% of the dose of the RESURF region 3. As a result, the dose at which the breakdown voltage has the peak value in the breakdown voltage curve 31 of the straight portion 15 can be equal to the dose at which the breakdown voltage has the peak value in the breakdown voltage curve 32 of the corner portion 16.

The point of the invention will be described with reference to the above description. The dose at which the breakdown voltage is the peak value in the breakdown voltage curve 32 of the corner portion 16 and the dose at which the breakdown voltage has the peak value in the breakdown voltage curve 31 of the straight portion 15 are calculated by simulations in advance. Then, the corner portion 16 is partially covered by the mask during ion implantation. The dose of impurities at which the breakdown voltage has the peak value in the breakdown voltage curve 31 of the straight portion 15 is implanted into the silicon substrate 1, the blockage ratio of the mask is adjusted such that the amount of ions implanted into the silicon substrate 1 in the corner portion 16 is equal to the dose at which the breakdown voltage has the peak value in the breakdown voltage curve 32 of the corner portion 16. In this way, the dose at which the breakdown voltage has the peak value in the breakdown voltage curve 32 of the corner portion 16 can be equal to the dose at which the breakdown voltage has the peak value in the breakdown voltage curve 31 of the straight portion 15.

As a result, as described above, it is possible to increase the breakdown voltage of the element almost to the peak value of the breakdown voltage curve 32 of the corner portion 16 and to increase a reduction in the breakdown voltage of the element due to the process variation to the lowest breakdown voltage which is determined by the breakdown voltage curve 32 of the corner portion 16. Therefore, the breakdown voltage can be higher than the breakdown voltage of the element in the double RESURF structure according to the related art and the reduction in the breakdown voltage of the element due to the process variation can be less than a reduction in the breakdown voltage of the element in the double RESURF structure according to the related art.

As can be seen from FIG. 3, since the breakdown voltage curve 31 of the straight portion 15 is higher than the breakdown voltage curve 32 of the corner portion 16 in the entire dose range of the RESURF region 3, the breakdown voltage of the element is determined by the breakdown voltage curve 32 of the corner portion 16 in this embodiment.

Figure 4:
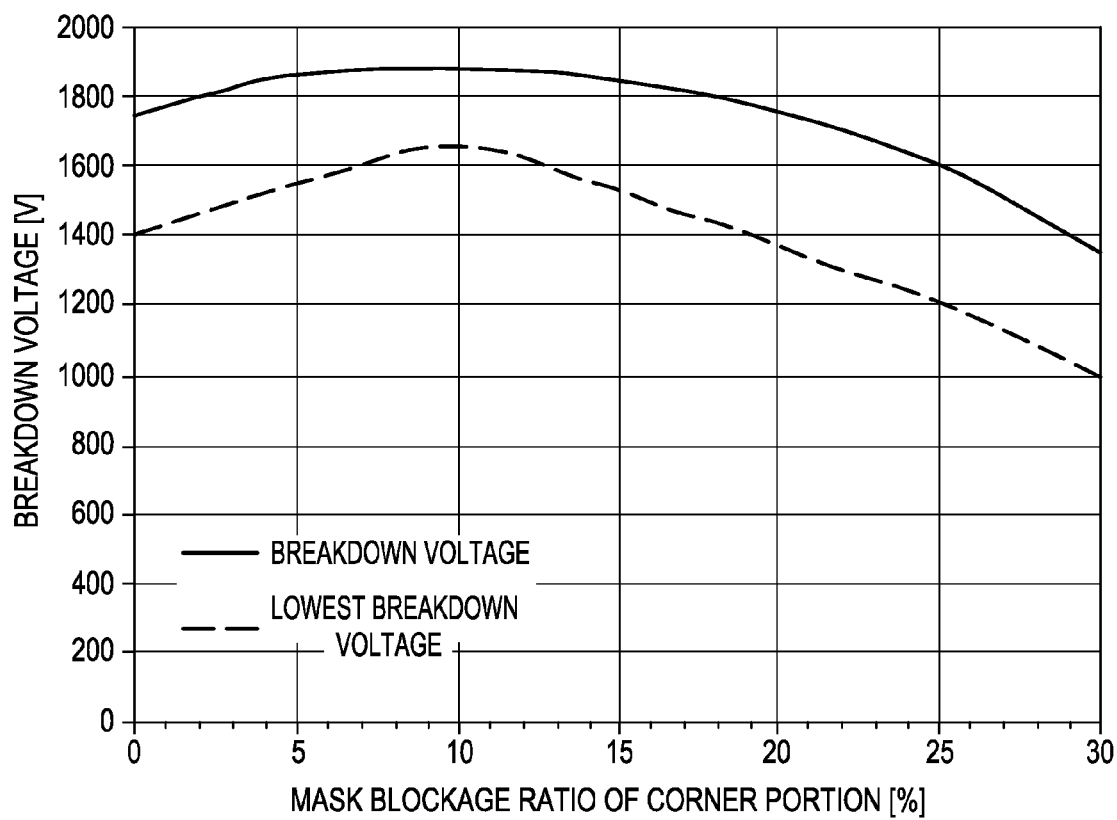
FIG. 4 is a characteristic diagram illustrating the breakdown voltage of the semiconductor device and the blockage ratio of p-type impurities for forming the RESURF region 3 in a corner portion 16, which is based on FIG. 3.

In FIG. 3, the blockage ratio of the p-type impurities implanted into the silicon substrate 1 in the corner portion 16 is 10%. In the invention, the blockage ratio may be changed to various values. In this case, it is possible to improve the breakdown voltage (element breakdown voltage) of the semiconductor device 100, as compared to the structure according to the related art. As described above, in the case in which the corner portion 16 of the RESURF region 3 is formed, the breakdown voltage when p-type impurity ions are implanted without being blocked forms the breakdown voltage curve 32b. When 10% of the p-type impurities for forming the RESURF region 3 of the corner portion 16 are blocked by the mask, the breakdown voltage curve 32b moves to the breakdown voltage curve 32. For example, it is presumed that, when the amount of p-type impurities for forming the RESURF region 3 of the corner portion 16, which is blocked by the mask, is gradually increased, the breakdown voltage curve 32b gradually moves to the position of the breakdown voltage curve 32. The relationship between the blockage ratio of the p-type impurities for forming the RESURF region 3 of the corner portion 16 and the breakdown voltage of the semiconductor device 100 is shown in FIG. 4 on the basis of the above-mentioned finding. FIG. 4 is a characteristic diagram illustrating the relationship between the blockage ratio of the p-type impurities for forming the RESURF region 3 of the corner portion 16 and the breakdown voltage of the semiconductor device based on FIG. 3. In FIG. 4, the term "breakdown voltage" means a breakdown voltage when a dose is set such that the minimum value of the breakdown voltage, which is obtained when the dose of the RESURF region 3 is in the range of ±10% of the set value, is the maximum. In addition, the term "lowest breakdown voltage" means the minimum value of the breakdown voltage when the dose of the RESURF region 3 is in the range of ±10% of the set value. As can be seen from this graph, the breakdown voltage of the semiconductor device 100 is higher than that in the related art until the dose of the RESURF region 3 in the corner portion 16 is 20% less than that in the straight portion 15. Therefore, when the total net amount of impurities of the RESURF region 3 in the corner portion 16 is less than the total net amount of impurities of the RESURF region 3 in the straight portion 15 (the mask blockage ratio of the corner portion) and the difference therebetween is equal to or less than 20%, it is possible to improve the breakdown voltage, as compared to the related art. The related art means a case in which the mask blockage ratio of the corner portion is zero.

It is preferable that the mask blockage ratio of the corner portion be in the range of 7% to 13%.

Figure 5A:
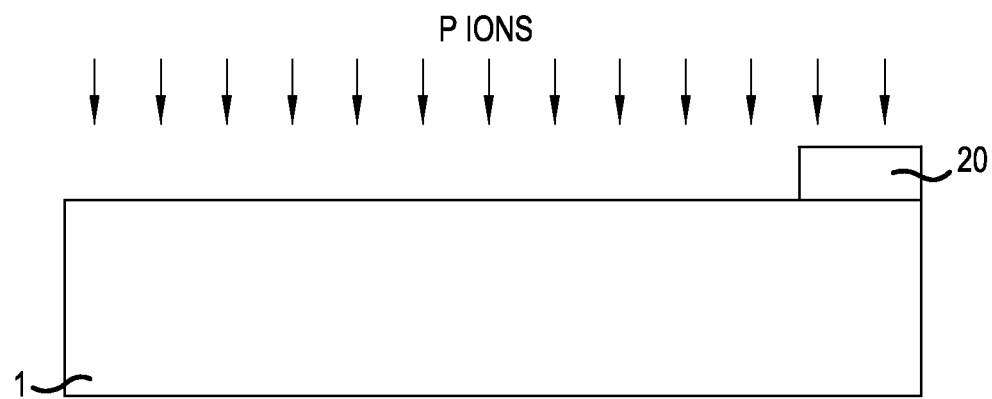
FIGS. 5A-5C are cross-sectional views sequentially illustrating the main manufacturing processes of a method for manufacturing a semiconductor device according to Embodiment 2 of the invention.
Figure 5B:
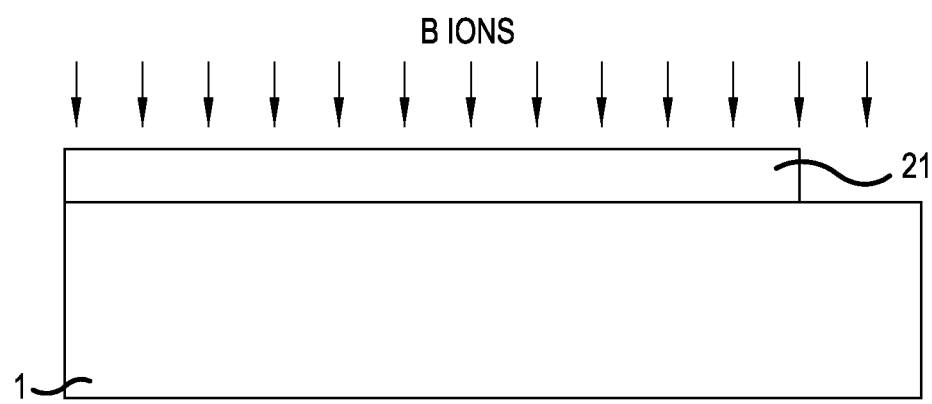
Figure 5C:
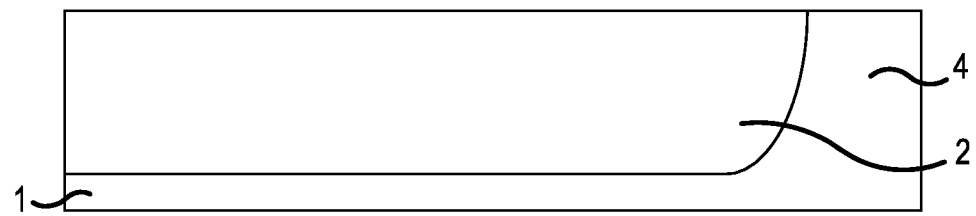

Embodiment 2 Next, a method for manufacturing the semiconductor device 100 shown in FIGS. 1 and 2A-2C will be described as an example of a method for manufacturing a semiconductor device according to Embodiment 2. FIGS. 5A to 11B are cross-sectional views sequentially illustrating the main manufacturing processes of the method for manufacturing the semiconductor device according to Embodiment 2. FIGS. 5A to 5C are cross-sectional views illustrating the cross-sections of a straight portion 15 and a corner portion 16 which are the same. In FIGS. 6A to 11B, a fragmentary view having "−1" which follows the alphabet (d, e, f, . . . ) indicating the fragmentary view is a cross-sectional view illustrating the straight portion 15 and a fragmentary view having "−2" is a cross-sectional view illustrating the corner portion 16. FIGS. 5A to 11B show processes for manufacturing the high voltage isolation structure 14 having a double RESURF structure which forms the semiconductor device.

First, a resist mask 20 for forming the n-type well region 2 is formed on the front surface of the p-type silicon substrate 1 with a specific resistance of 400Ωcm. Then, phosphorus (P) ions are implanted into the front surface of the silicon substrate 1 under the conditions of an acceleration energy of 50 keV and a dose of $4.0 \times 10^{12}/cm^2$, using the resist mask 20 as a mask (FIG. 5A).

Then, the resist mask 20 is removed and a resist mask 21 for forming the p-type diffusion layer 4 is formed on the front surface of the silicon substrate 1. Then, boron (B) ions are implanted into the front surface of the silicon substrate 1 under the conditions of an acceleration energy of 150 keV and a dose of $3.0 \times 10^{12}/cm^2$, using the resist mask 21 as a mask (FIG. 5B).

Figure 6A:
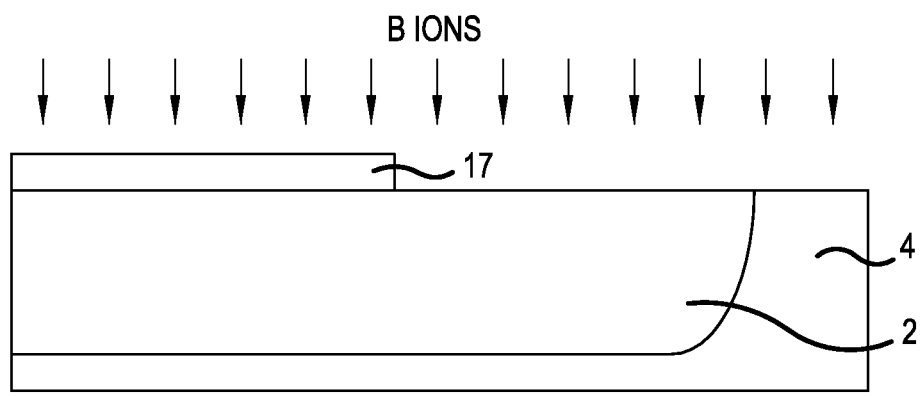
FIGS. 6A and 6B are cross-sectional views sequentially illustrating the main manufacturing processes of the method for manufacturing the semiconductor device according to Embodiment 2 of the invention, which follows FIGS. 5A-5C.
Figure 6B:
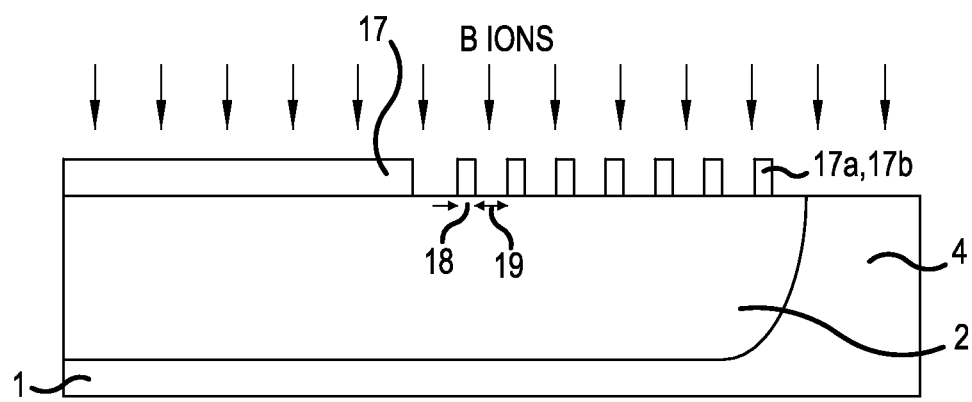

Then, the resist mask 21 is removed and thermal diffusion is performed at a processing temperature of 1200° C. for a processing time of 300 minutes to form the well region 2 and the diffusion layer 4 (FIG. 5C). Then, a resist mask 17 (the blockage ratio of the corner portion 16 is 10%) for forming the RESURF region 3 is formed. Then, B ions are implanted into the front surface of the silicon substrate 1 under the conditions of an acceleration energy of 50 keV and a dose of $5.5 \times 10^{12}/cm^2$, using the resist mask 17 as a mask. In this case, when the amount of B ions per unit area in the silicon substrate 1 in the straight portion 15 is $5.5 \times 10^{12}/cm^2$, the amount of B ions per unit area in the corner portion 16 is substantially $4.95 \times 10^{12}/cm^2$ since the area of the corner portion 16 covered by the resist mask 17 is 10% more than that of the straight portion 15 covered by the resist mask 17 (FIGS. 6A and 6B).

Figure 12A:
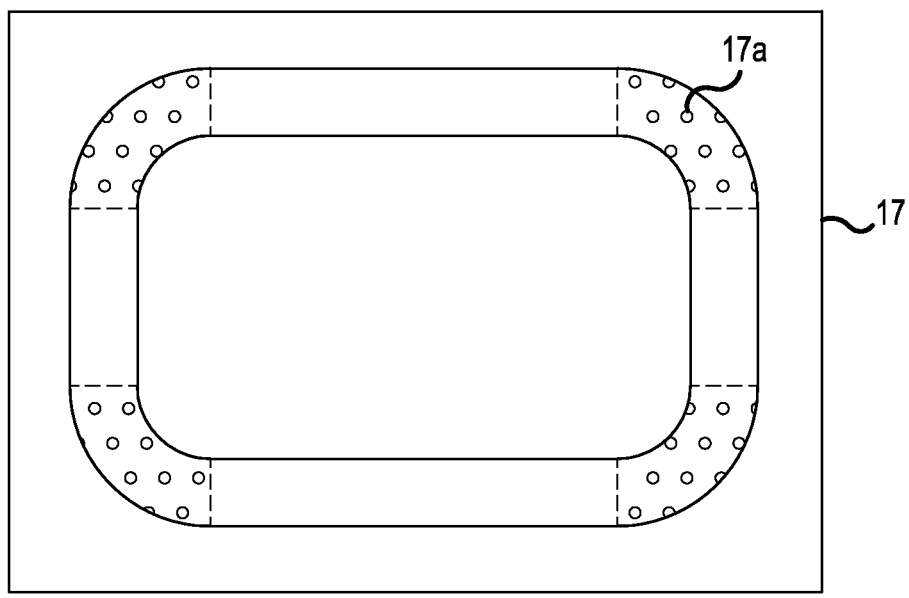
FIGS. 12A and 12B are plan views illustrating a resist mask 17 used in ion implantation shown in FIGS. 5A-5C.
Figure 12B:
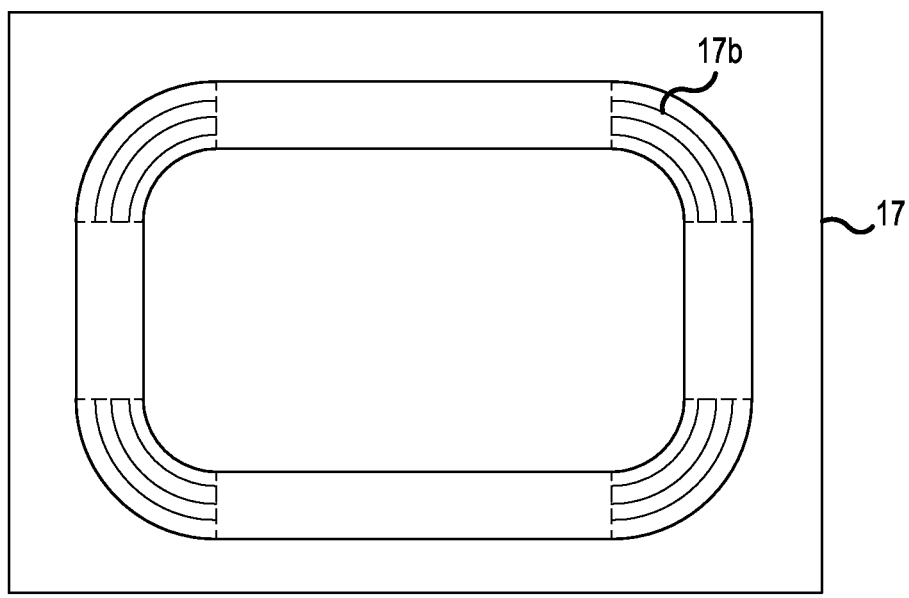
Figure 13:
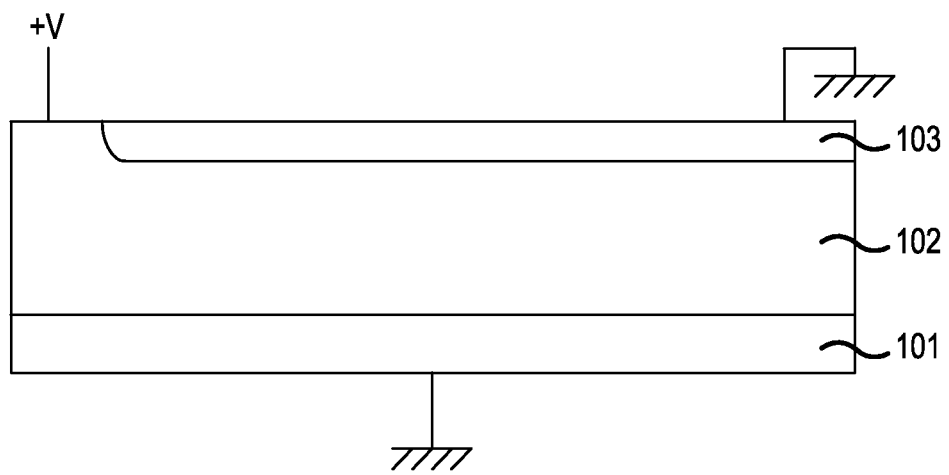
FIG. 13 is a conceptual cross-sectional view illustrating a semiconductor device including a high voltage isolation structure having a double RESURF structure.
Figure 14A:
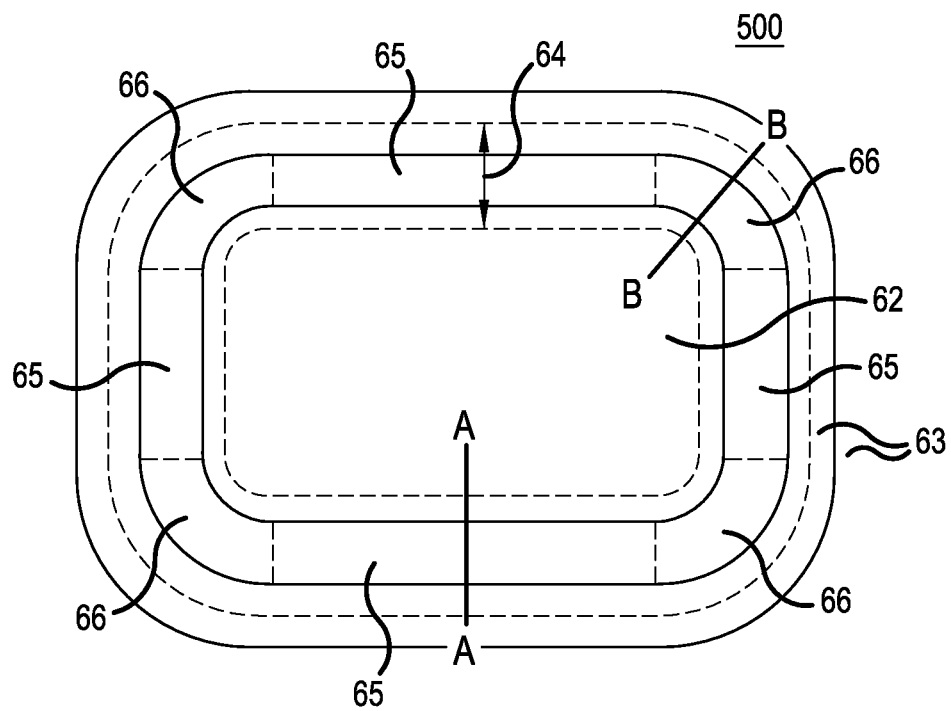
FIGS. 14A and 14B are diagrams illustrating the structure of a semiconductor device 500 including a high voltage isolation structure 64 having a double RESURF structure according to the related art.
Figure 14B:
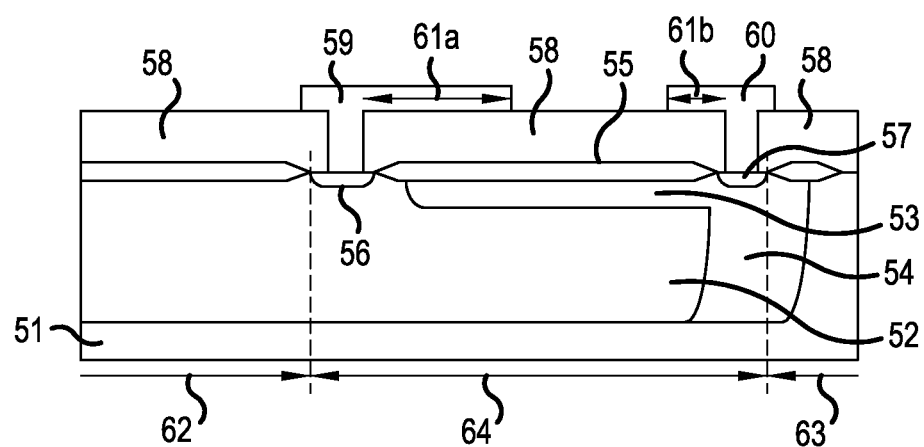
Figure 15:
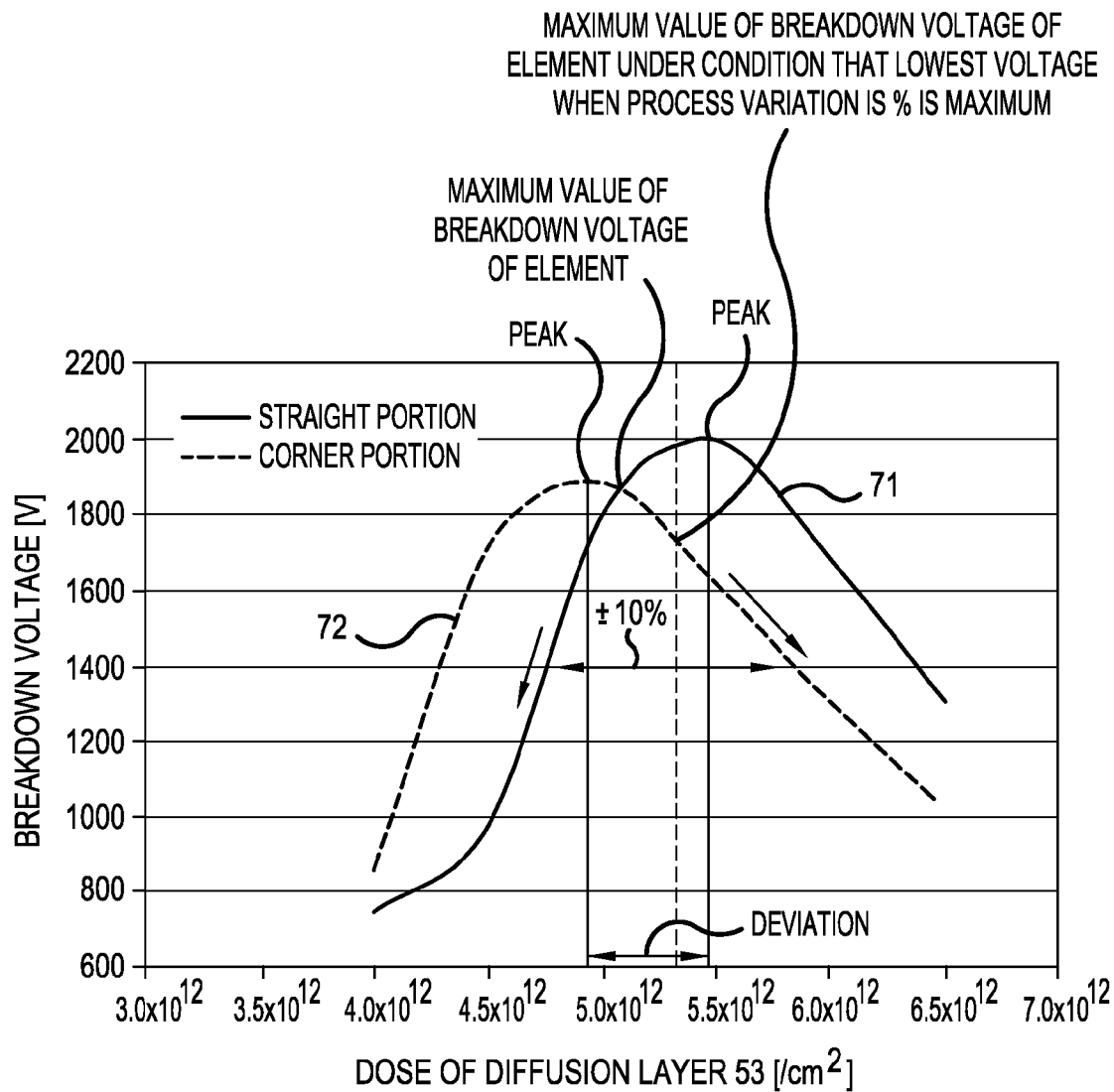
FIG. 15 is a characteristic diagram illustrating the simulation result of the relationship between a breakdown voltage and the ion implantation dose of a p-type diffusion layer 53 in a straight portion 65 and a corner portion 66 of the semiconductor device 500 shown in FIG. 14.
Figure 16A:
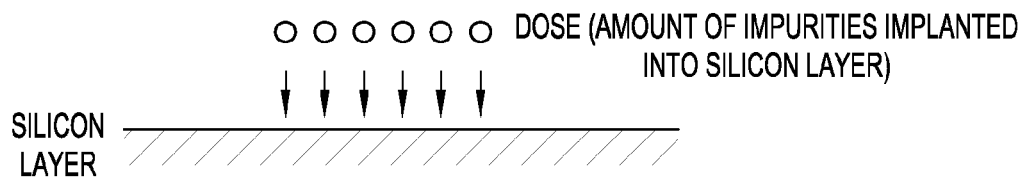
FIGS. 16A-16D are explanatory diagrams illustrating terms.
Figure 16B:
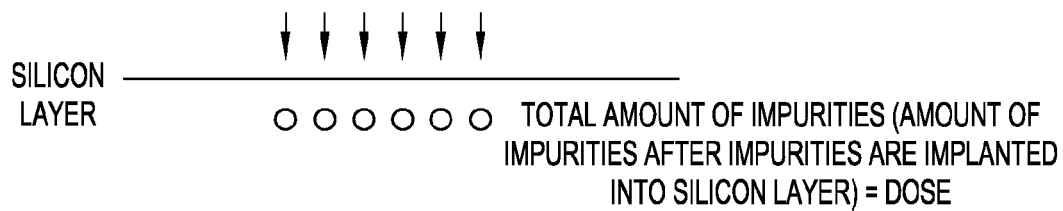
Figure 16C:
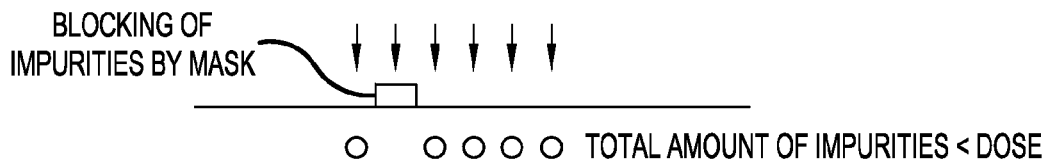
Figure 16D:
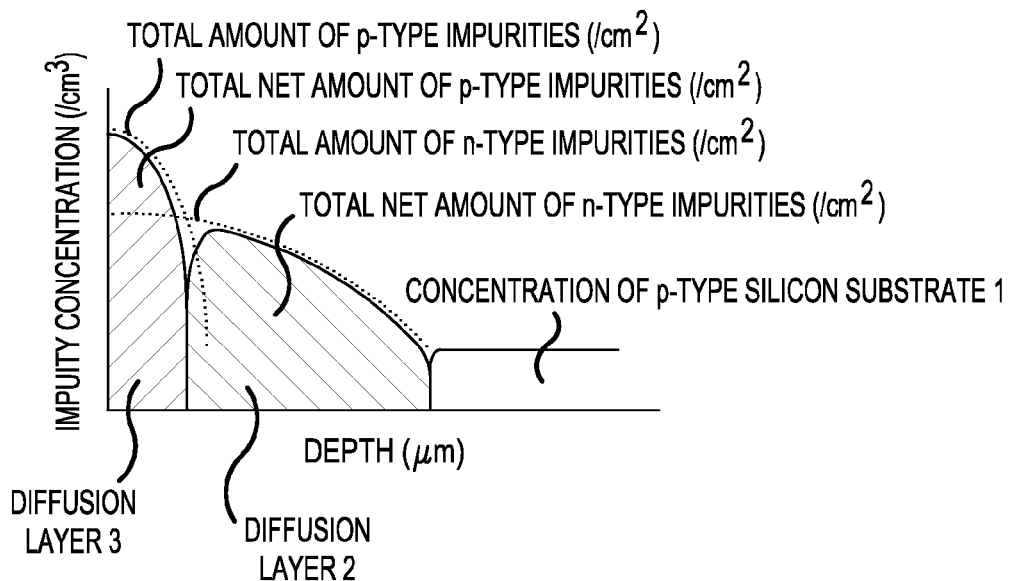

FIGS. 12A and 12B are plan views illustrating the resist mask 17 used in the ion implantation shown in FIGS. 5A-5C. FIG. 12A shows the planar layout of the resist mask 17 having a blocking pattern in which a circular dot-shaped mask portion 17a is formed in the corner portion 16. FIG. 12B shows the planar layout of the resist mask 17 having a blocking pattern in which a curved thin strip-shaped mask portion 17b is formed in the corner portion 16. However, the circular dot-shaped mask portion 17a shown in FIG. 12A may be changed to a triangular, rectangular, or polygonal dot-shaped mask portion. In addition, the curved thin strip-shaped mask portion 17b shown in FIG. 12B may be changed to a radial strip-shaped mask portion.

As such, in ion implantation for forming the RESURF region 3, the resist mask 17 is used in which the area density of a blocking portion that covers the well region 2 in the corner portion 16 shown in FIGS. 12A and 12B are higher than the area densities of a blocking portion that covers the well region 2 in the straight portion 15. Here, when the ratio of a blocking portion 18 of the resist mask 17 to a non-blocking portion 19 in the corner portion 16 is the blockage ratio, the blockage ratio in the straight portion 15 is 0% (the straight portion 15 is not blocked) and the blockage ratio in the corner portion 16 is 10%. Even when the blockage ratio in the corner portion 16 is increased or decreased by 10%, the optimum conditions (the peaks of the breakdown voltage curve) in the straight portion 15 and the corner portion 16 are not identical to each other. Therefore, it is preferable that the blockage ratio of the resist mask 17 be about 10%.

Figure 7A:
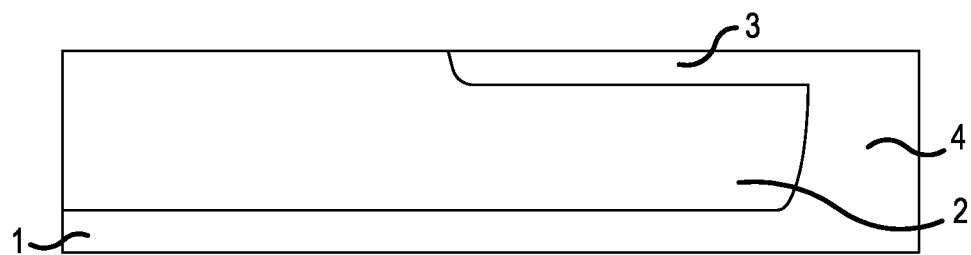
FIGS. 7A and 7B are cross-sectional views sequentially illustrating the main manufacturing processes of the method for manufacturing the semiconductor device according to Embodiment 2 of the invention, which follows FIGS. 6A and 6B.
Figure 7B:
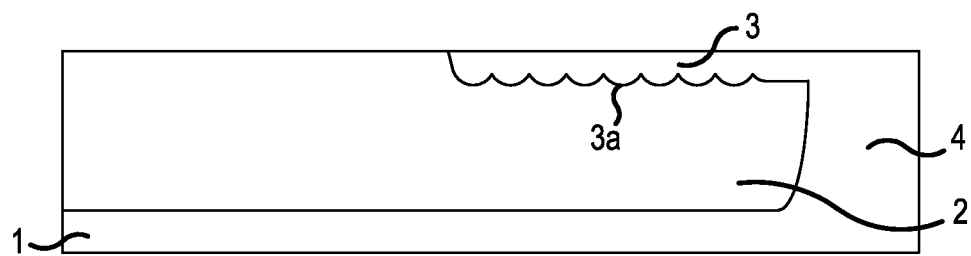
Figure 8A:
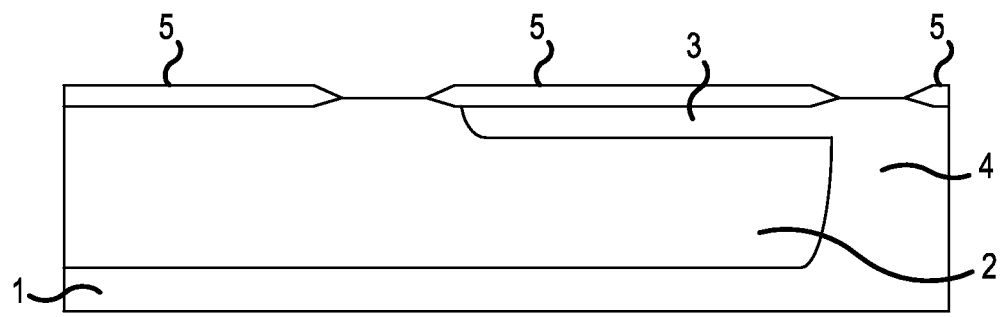
FIGS. 8A and 8B are cross-sectional views sequentially illustrating the main manufacturing processes of the method for manufacturing the semiconductor device according to Embodiment 2 of the invention, which follows FIGS. 7A and 7B.
Figure 8B:
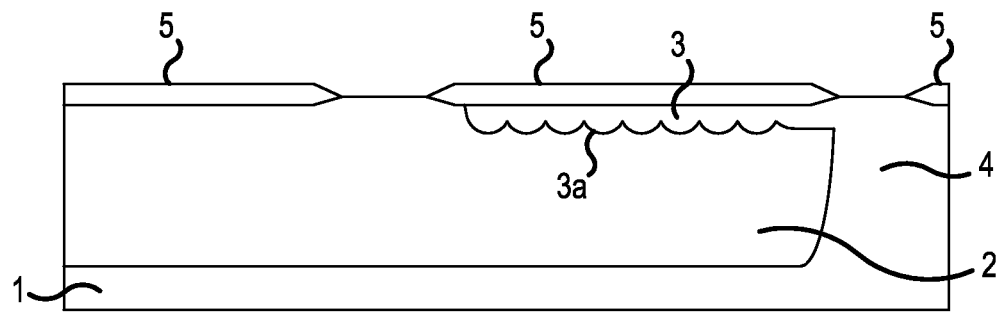

Then, the resist mask 17 is removed and thermal diffusion is performed at a processing temperature of 1150° C. for a processing time of 240 minutes to form the RESURF region 3 (FIGS. 7A and 7B). As described above, since the well region 2 in the corner portion 16 is covered by the mask portion 17a or 17b with a predetermined blocking pattern, a portion of the well region 2, into which B ions are not implanted, in the corner portion 16 is selectively formed. Therefore, the portion 3d which has high impurity concentration and a large diffusion depth and the portion 3e which has low impurity concentration and a small diffusion depth are formed in the RESURF region 3 of the corner portion 16. Then, a silicon nitride film is formed by a low pressure chemical vapor deposition (LPCVD) method and etching is performed such that a portion of the silicon nitride film on the well region 2 and the RESURF region 3 remains. Then, a heat treatment is performed at a processing temperature of 1000° C. in an oxygen atmosphere to form the LOCOS (Local Oxidation of Silicon) film 5 (FIGS. 8A and 8B).

Figure 9A:
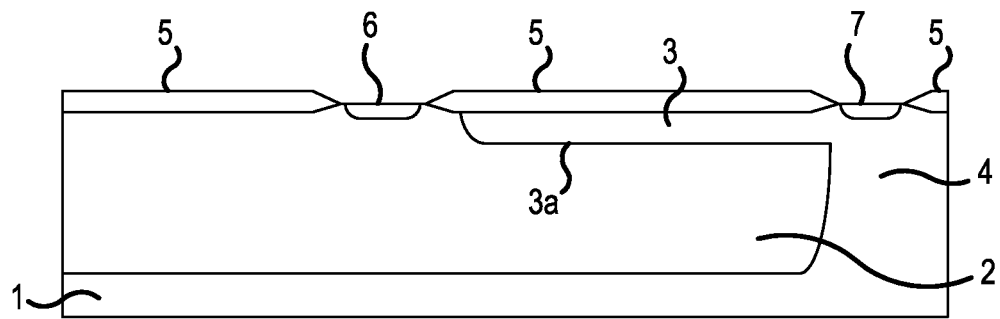
FIGS. 9A and 9B are cross-sectional views sequentially illustrating main manufacturing processes of the method for manufacturing the semiconductor device according to Embodiment 2 of the invention, which follows FIGS. 8A and 8B.
Figure 9B:
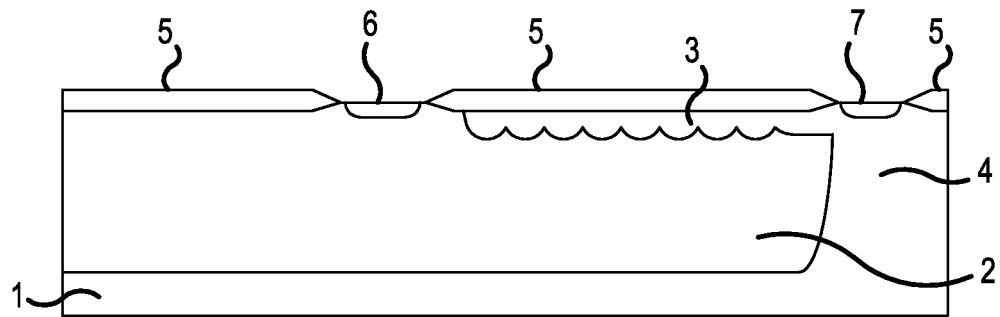

Then, arsenic (As) ions are implanted into an active region above the well region 2 under the conditions of an acceleration energy of 30 keV and a dose of $3.0 \times 10^{15}/cm^2$ to form the high-concentration n-type region 6 for contact with the well region 2. Then, boron fluoride ($BF_2$) ions are implanted into the active region above the RESURF region 3 under the conditions of an acceleration energy of 30 keV and a dose of $3.0 \times 10^{15}/cm^2$ to form the high-concentration p-type region 7 for contact with the RESURF region 3 (FIGS. 9A and 9B).

Figure 10A:
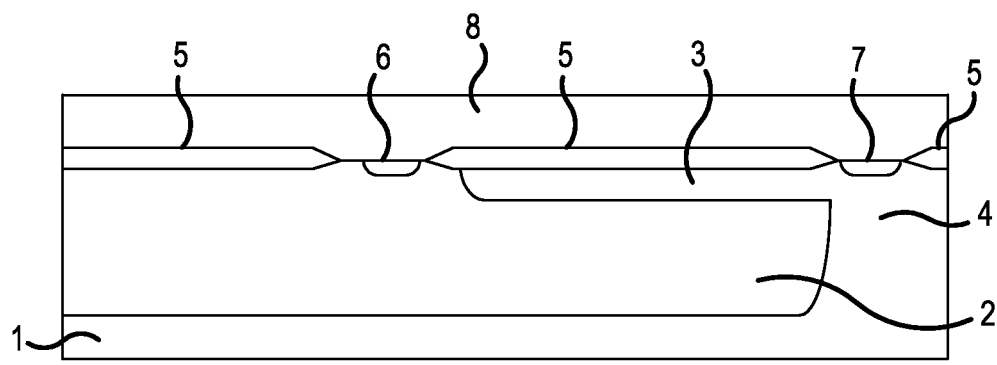
FIGS. 10A and 10B are cross-sectional views sequentially illustrating the main manufacturing processes of the method for manufacturing the semiconductor device according to Embodiment 2 of the invention, which follows FIGS. 9A and 9B.
Figure 10B:
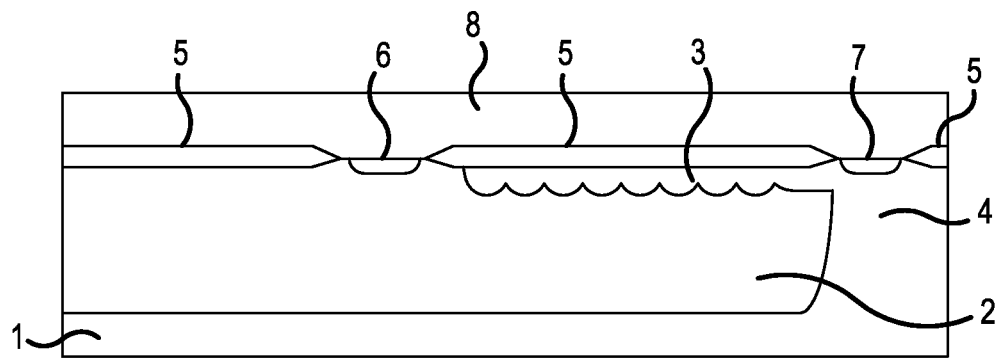
Figure 11A:
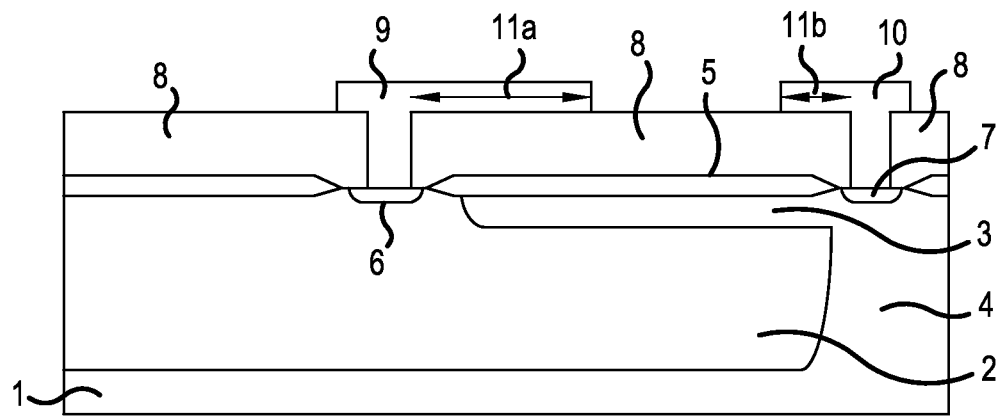
FIGS. 11A and 11B are cross-sectional views sequentially illustrating the main manufacturing processes of the method for manufacturing the semiconductor device according to Embodiment 2 of the invention, which follows FIGS. 10A and 10B.
Figure 11B:
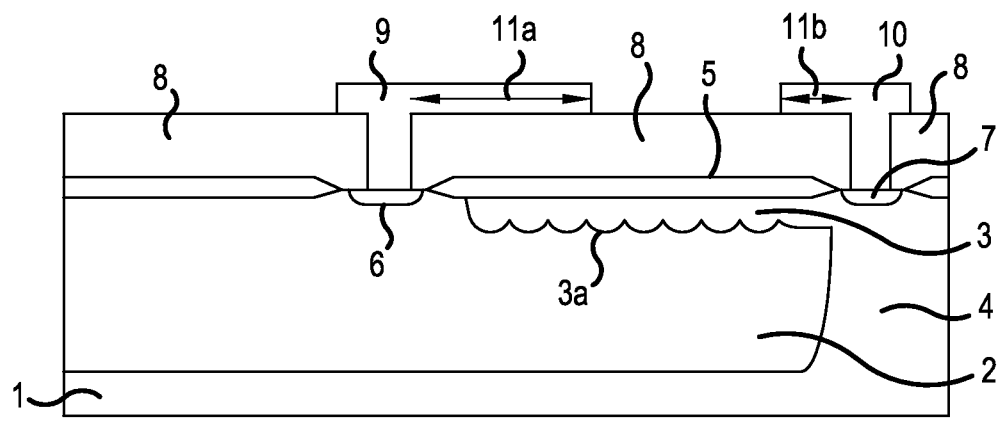

Then, the interlayer insulating film 8 is formed on the front surface of the silicon substrate 1 and a heat treatment is performed to activate the As ions and the $BF_2$ ions (FIGS. 10A and 10B). Then, the interlayer insulating film 8 is selectively removed by reactive ion etching (RIE) and contact holes are formed in the high-concentration n-type region 6 and the high-concentration p-type region 7. Then, an aluminum film is formed on the interlayer insulating film 8 by a sputtering method so as to fill the contact holes. Then, the aluminum film is etched to form the electrode 9, the electrode 10, the field plate 11a, and the field plate 11b (FIGS. 11A and 11B). In this way, the semiconductor device 100 is completed.

As described above, according to each embodiment, during ion implantation for forming the RESURF region 3, since the corner portion 16 is selectively covered by the resist mask 17 having the mask portions 17a or 17b which are arranged in a predetermined blocking pattern, the high voltage isolation structure 14 is formed in which the total amount of impurities per unit area in the RESURF region 3 in the corner portion 16 is less than the total amount of impurities per unit area in the RESURF region 3 in the straight portion 15. In addition, the dose of the RESURF region 3 which satisfies the optimum conditions of the corner portion 16 can be equal to the dose of the RESURF region 3 which satisfies the optimum conditions of the straight portion 15. As a result, the dose of the RESURF region 3 in the corner portion 16 is equal to the dose of the RESURF region 3 in the straight portion 15 and it is possible to achieve a high breakdown voltage, as compared to the breakdown voltage structure according to the related art.

According to each embodiment, the blockage ratio of the resist mask 17 is adjusted such that the entire breakdown voltage curve 32 of the corner portion 16 is disposed inside the breakdown voltage curve 31 of the straight portion 15. Therefore, it is possible to achieve a high breakdown voltage, as compared to the breakdown voltage structure according to the related art.

In each embodiment, as described above, during ion implantation, the blocking mask (resist mask 17) is used to adjust the total net amount of impurities per unit area in the diffusion layer (RESURF region 3), which is arranged on the front surface side of the substrate, in the corner portion 16 to be less than that in the straight portion 15. Ion implantation and a heat treatment are simultaneously performed for the straight portion 15 and the corner portion 16 using the blocking mask while the total net amount of impurities of the diffusion layer in both the straight portion 15 and the corner portion 16 satisfies a predetermined RESURF condition. As such, even when the ion implantation is simultaneously performed for the straight portion 15 and the corner portion 16, the use of the blocking mask makes it possible to adjust the total net amounts of impurities of the diffusion layer in the straight portion 15 and the corner portion 16 (the breakdown voltage curve 32b of the corner portion 16 when the dose of the RESURF region 3 is not blocked by the mask is moved to the breakdown voltage curve 32 which has the peak at the dose of the RESURF region 3 corresponding to the peak value of the breakdown voltage curve 31) such that the breakdown voltage has the maximum value (31a and 32c) in the breakdown voltage curves 31 and 32b which are respectively calculated from the straight portion 15 and the corner portion 16. Since both the straight portion 15 and the corner portion 16 have the maximum breakdown voltage, it is possible to improve the breakdown voltage of the element, as compared to the structure according to the related art. In addition, since ion implantation is simultaneously performed for the straight portion 15 and the corner portion 16, it is possible to reduce a process variation and to suppress a reduction in the breakdown voltage of the element, as compared to the structure in which ion implantation is separately performed for the straight portion 15 and the corner portion 16.

In the above-described embodiments of the invention, the silicon substrate is used. However, the invention is not limited thereto. For example, a SiC substrate or a compound semiconductor substrate may be used instead of the silicon substrate. In addition, in the invention, the semiconductor substrate may be a semiconductor wafer which is manufactured with a uniform impurity concentration or a semiconductor substrate in which an epitaxial growth layer with a uniform impurity concentration is formed on a semiconductor wafer. In the semiconductor substrate having the epitaxial growth layer formed thereon, the well region and the RESURF region are formed in the epitaxial growth layer which is formed with a uniform impurity concentration. In each embodiment, the first conductivity type is a p type and the second conductivity type is an n type. However, in the invention, the first conductivity type may be an n type and the second conductivity type may be a p type. In this case, the same effect as described above is obtained.

As described above, the semiconductor device and the semiconductor device manufacturing method according to the invention are useful for a semiconductor device with a double RESURF structure.

What is claimed is:
1. A semiconductor device comprising:
a well region of a second conductivity type that is selectively formed in a surface layer of a front surface of a semiconductor substrate of a first conductivity type;
a first region of the first conductivity type which is formed in the well region and has an annular shape in a plan view;
a second region of the second conductivity type that is formed inside the first region of the well region and has an annular shape in a plan view;
a RESURF region of the first conductivity type that is formed between the first region and the second region in the well region; and
a high voltage isolation structure that has a double RESURF structure in which the well region is interposed between the semiconductor substrate and the RESURF region,
wherein the high voltage isolation structure has a planar shape that includes a straight portion and a corner portion which is connected to the straight portion and has a constant curvature,
the RESURF region in the corner portion includes a high concentration region and a low concentration region which has a smaller diffusion depth and a lower impurity concentration than the high concentration region,
both a first total net amount of impurities per unit area in the straight portion of the RESURF region and a second total net amount of impurities per unit area in the corner portion of the RESURF region are equal to or less than $1.4 \times 10^{12}$ [/cm$^2$],
a third total net amount of impurities of the well region is equal to or less than $2.8 \times 10^{12}$ [/cm$^2$],
both a value obtained by subtracting the first total net amount of impurities from the third total net amount of impurities and a value obtained by subtracting the second total net amount of impurities from the third total net amount of impurities are equal to or less than $1.4 \times 10^{12}$ [/cm$^2$],
the second total net amount of impurities is less than the first total net amount of impurities, and
a maximum breakdown voltage of the straight portion is higher than a maximum breakdown voltage of the corner portion.
2. The semiconductor device according to claim 1, further comprising:
an isolation region of the first conductivity type that is formed outside the RESURF region at a depth that is equal to or more than the depth of the well region from the front surface of the semiconductor substrate so as to surround the well region.

3. The semiconductor device according to claim 1,
wherein the second total net amount of impurities is less than the first total net amount of impurities and a difference therebetween is equal to or less than 20%.

4. The semiconductor device according to claim 1,
wherein the semiconductor substrate and the RESURF region are electrically connected to each other.

5. The semiconductor device according to claim 1,
wherein the high concentration region and the low concentration region come into contact with each other and are alternately arranged.

6. A method for manufacturing a semiconductor device including: a well region of a second conductivity type that is selectively formed in a surface layer of a front surface of a semiconductor substrate of a first conductivity type; a first region of the first conductivity type which is formed in the well region and has an annular shape in a plan view; a second region of the second conductivity type that is formed inside the first region of the well region and has an annular shape in a plan view; a RESURF region of the first conductivity type that is formed between the first region and the second region in the well region; and a high voltage isolation structure that has a double RESURF structure in which the well region is interposed between the semiconductor substrate and the RESURF region, wherein the high voltage isolation structure has a planar shape that includes a straight portion and a corner portion which is connected to the straight portion and has a constant curvature, the RESURF region in the corner portion includes a high concentration region and a low concentration region which has a smaller diffusion depth and a lower impurity concentration than the high concentration region, both a first total net amount of impurities per unit area in the straight portion of the RESURF region and a second total net amount of impurities per unit area in the corner portion of the RESURF region are equal to or less than $1.4 \times 10^{12}$[/cm$^2$], a third total net amount of impurities of the well region is equal to or less than $2.8 \times 10^{12}$[/cm$^2$], both a value obtained by subtracting the first total net amount of impurities from the third total net amount of impurities and a value obtained by subtracting the second total net amount of impurities from the third total net amount of impurities are equal to or less than $1.4 \times 10^{12}$[/cm$^2$], and the second total net amount of impurities is less than the first total net amount of impurities,
the method comprising:
a first step of forming the well region on the semiconductor substrate using the implantation of second-conductivity-type impurity ions and a heat treatment; and
a second step of forming the RESURF region in the straight portion and the corner portion of the high voltage isolation structure using the implantation of first-conductivity-type impurity ions and the heat treatment,
wherein, in the second step, the corner portion is partially covered by a mask and the amount of first-conductivity-type impurity ions which are implanted into the semiconductor substrate is less than the amount of first-conductivity-type impurity ions which are implanted into the semiconductor substrate in the straight portion.

7. The method for manufacturing the semiconductor device according to claim 6,
wherein, in the second step, a dose of the first-conductivity-type impurities, which is obtained by subtracting a dose at which a breakdown voltage of the corner portion is the maximum from a dose at which the breakdown voltage of the straight portion is the maximum, is blocked by the mask to reduce the amount of first-conductivity-type impurity ions implanted into the semiconductor substrate.

8. The method for manufacturing the semiconductor device according to claim 6,
wherein, in the second step, a blockage ratio of the mask is adjusted to adjust the total net amount of impurities of the RESURF region such that a maximum breakdown voltage of a breakdown voltage curve of the straight portion, which is calculated in advance, with respect to the dose of the RESURF region is equal to a maximum breakdown voltage of a breakdown voltage curve of the corner portion, which is calculated in advance, with respect to the dose of the RESURF region.

9. A semiconductor device comprising:
a well region of a second conductivity type that is selectively formed in a surface layer of a front surface of a semiconductor substrate of a first conductivity type;
a first region of the first conductivity type which is formed in the well region and has an annular shape in a plan view;
a second region of the second conductivity type that is formed inside the first region of the well region and has an annular shape in a plan view;
a RESURF region of the first conductivity type that is formed between the first region and the second region in the well region; and
a high voltage isolation structure that has a double RESURF structure in which the well region is interposed between the semiconductor substrate and the RESURF region,
wherein the high voltage isolation structure has a planar shape that includes a straight portion and a corner portion which is connected to the straight portion and has a constant curvature,
the RESURF region in the corner portion includes a high concentration region and a low concentration region which has a smaller diffusion depth and a lower impurity concentration than the high concentration region,
both a first total net amount of impurities per unit area in the straight portion of the RESURF region and a second total net amount of impurities per unit area in the corner portion of the RESURF region are equal to or less than $1.4 \times 10^{12}$[/cm$^2$],
a third total net amount of impurities of the well region is equal to or less than $2.8 \times 10^{12}$[/cm$^2$],
both a value obtained by subtracting the first total net amount of impurities from the third total net amount of impurities and a value obtained by subtracting the second total net amount of impurities from the third total net amount of impurities are equal to or less than $1.4 \times 10^{12}$[/cm$^2$],
the second total net amount of impurities is less than the first total net amount of impurities, and
a maximum breakdown voltage of the straight portion is substantially equal to a maximum breakdown voltage of the corner portion.

* * * * *